United States Patent [19]

Freeman

[11] Patent Number: 5,210,395

[45] Date of Patent: May 11, 1993

[54] ELECTRIC IRON HAVING ELECTROSTATIC DISCHARGE PROTECTION

[75] Inventor: Arthur H. Freeman, Huntington, Conn.

[73] Assignee: Black & Decker Inc., Newark, Del.

[21] Appl. No.: 833,220

[22] Filed: Feb. 10, 1992

[51] Int. Cl.$^5$ .................. H05B 1/00; D06F 75/08; D06F 75/26; H05F 3/00

[52] U.S. Cl. .................................. 219/250; 38/82; 38/88; 38/90; 219/240; 361/212; 361/220; 361/424

[58] Field of Search ................ 219/245–259, 219/240; 38/74, 75, 82, 90, 88; 361/212, 424, 220

[56] References Cited

U.S. PATENT DOCUMENTS

| 4,667,266 | 5/1987 | Masuoka et al. | 361/212 |
|---|---|---|---|
| 4,745,260 | 5/1988 | Albinger et al. | 219/250 |
| 4,821,320 | 4/1989 | Amdert et al. | 361/212 X |
| 5,029,041 | 7/1991 | Robinson et al. | 361/212 |
| 5,031,076 | 7/1991 | Kiku | 361/424 |
| 5,063,474 | 11/1991 | Igarashi | 361/220 |

Primary Examiner—Anthony Bartis
Attorney, Agent, or Firm—Barry E. Deutsch

[57] ABSTRACT

An electric iron includes a handle having first and second members. Electronic components are mounted in a first one of the handle members. An electrostatic protection carrier is mounted in the second of the handle members. The electrostatic discharge protection carrier includes a first electrically conductive track extending parallel to and lying adjacent a first section of a seam formed by joining said first and second handle members. A second electrically conductive track extends parallel to and is spaced from said first track and extends parallel to and lies adjacent a second section of the seam. A third electrically conductive track interconnects the first and second tracks. An electrical conductor is connected to a selected one of the first or second tracks and to a portion of the iron normally held at a relatively low potential for transmitting any electrostatic discharge voltage collected by said electrostatic discharge protection carrier to said low potential iron portion.

6 Claims, 2 Drawing Sheets

ELECTRIC IRON HAVING ELECTROSTATIC DISCHARGE PROTECTION

This invention relates to an electric iron and in particular to an electrostatic discharge protector mounted in close proximity to the electronics of the iron for protecting the electronics.

Many modern electric steam irons include electronic components for performing various functions such as automatically shutting the iron off after predetermined periods of time when the iron is at rest on either its soleplate or on its heel rest. Such electronics also operate lights which indicate to the user that the iron is ready for use and audible signaling devices to alert the user of possible functional changes. The electronic components are generally mounted in the iron's handle.

It is known that electronic components are susceptible to damage from voltage caused by electrostatic discharge. The voltage generated from an electrostatic discharge can readily exceed 20,000 volts. The iron's handle is generally made of two members, joined together to define a seam. The electronic components are typically mounted on the upwardly facing surface of a lower handle member. An upper or second handle member is then placed over the lower handle member, with the two handle members being joined to define a longitudinally extending seam at the interface of the two handle members. In the event electrostatic discharge voltage that may be generated when the user grasps the iron's handle gains entry into the handle along the seam, the voltage may cause considerable damage or destruction to the sensitive electronic components. Spring loaded power switches, typically located in the upper face of the handle, provide additional potential entry ports into the handle for electrostatic discharge voltage.

Heretofore, some manufacturers have placed conductive foil in the upper handle member to act as a metallic carrier for the electrostatic discharge voltage to protect the electronic components housed in the handle. The foil, while proving effective in protecting the electronic components against damage by electrostatic discharge, has created assembly problems due to its relatively thin thickness (0.003–0.004 inches). It is relatively difficult to assemble the thin foil into the iron handle when the irons are being manufactured by mass production techniques.

Accordingly, it is an object of the present invention to protect electronic components mounted in the handle of an electric iron against damage from electrostatic discharge voltage.

SUMMARY OF THE INVENTION

The foregoing object and other objects of the invention are attained in an electric iron having a handle. The handle has a first member housing electronic components and a second member overlying the first member. The iron further includes a soleplate having an electrically operated resistance element in heat transfer relation therewith. First electrical conductor means are connected to the resistance element for connecting the resistance element to a source of electrical power. Electrostatic discharge protection means is mounted in the second member of the handle. The electrostatic discharge protection means comprising a first electrically conductive track extending substantially parallel to and lying adjacent a first section of a seam formed by joining the first and second handle members. The electrostatic discharge protection means further comprises a second electrically conductive track lying parallel to and spaced from the first track and extending parallel to an lying adjacent a second section of the seam. A protection means further includes a third electrically conductive track interconnecting the first and second tracks, and a second electrical conductor means connected to a selected one of the first or second tracks and to a portion of the iron normally held at a relatively low potential for transmitting any electrostatic discharge voltage collected by the electrostatic discharge protection means to the low potential iron portion.

DESCRIPTION OF THE PREFERRED EMBODIMENT

Figure 1:
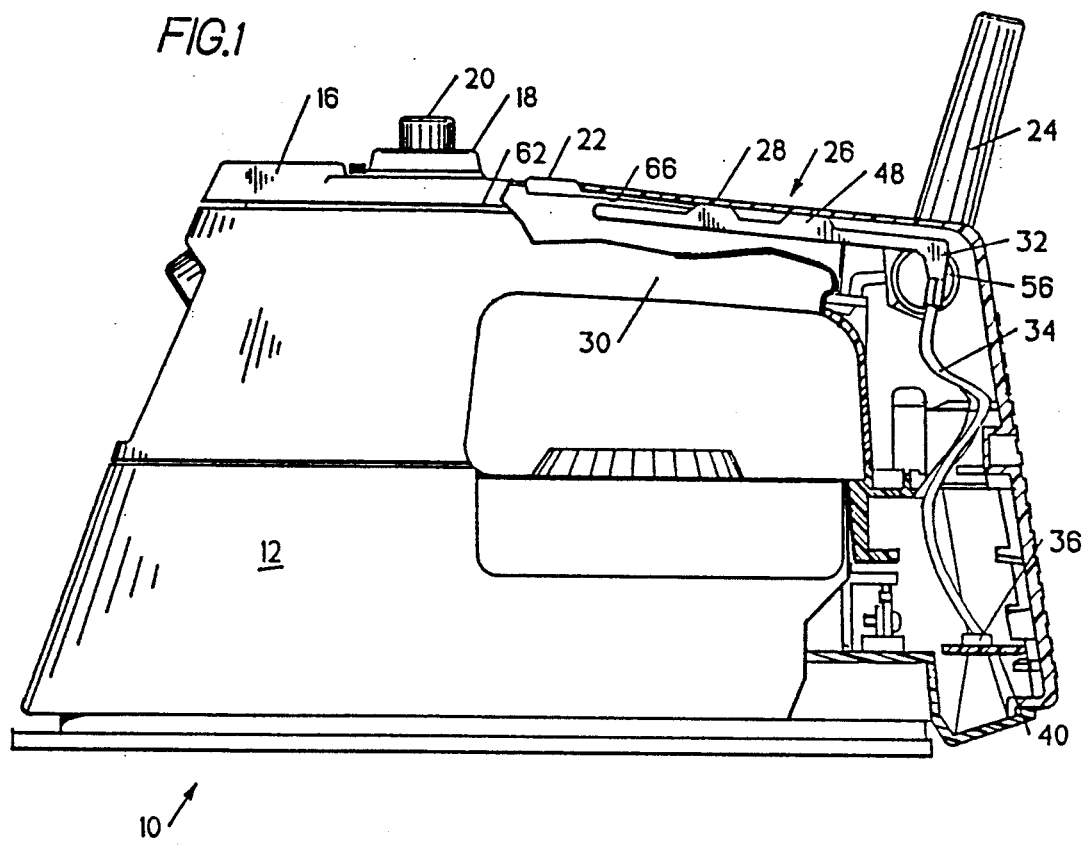
FIG. 1 is a side elevational view, partially in section, illustrating the electrostatic discharge protection device of the present invention.

Referring now to the various figures of the drawing, a preferred embodiment of the present invention shall now be described in detail. In referring to the various figures, like numerals shall refer to like parts.

Referring now to FIG. 1, there is disclosed an elevational view of a conventional electric iron 10. Iron 10 includes housing 12. Housing 12 is typically formed from a suitable thermal plastic material. A soleplate 14 is connected to the bottom of housing 12 via conventional means.

A thermostat control knob 16 extends upwardly from the top face of housing 12. A steam control knob 18 and a spray-surge control button 20 also extend upwardly from the top face of housing 12. The top face of housing 12 also includes a power on switch 22 which can be activated by the user. Housing 12 further includes handle 26. Handle 26 includes an upper member 28 and a lower member 30. An electric power cord 24 extends through handle 26 for connection to an A.C. source of electrical energy. Upper handle member 28 is connected to lower handle member 30 along longitudinally extending seam 62 which is defined by the interface between the two handle members. Switch 22 includes a portion 23 formed from plastic, glass or other transparent material. Portion 23 is aligned with second transparent member 64 which represents one or more signal lights. The light(s) can be used to provide visual signals to the user for example, indicating when the iron is ready for use.

Figure 4:
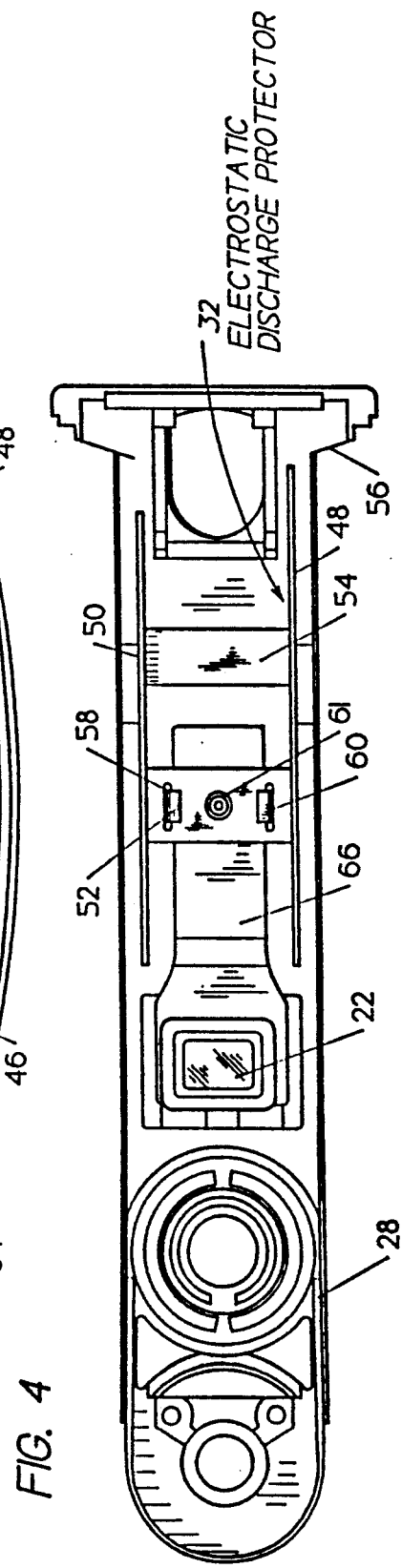
FIG. 4 is a plan view taken from the underside of the upper handle member.

As illustrated in FIGS. 1 and 4, the inside surface of upper handle member 28 includes a member 32 mounted thereon. The member is connected to the inside surface of the upper member via heat staked bosses 58, 60 and 61. Member 32 is electrically conductive and includes a first electrically conductive track 48 extending parallel to and lying adjacent a first section of seam 62. Member 32 includes a second electrically conductive track 5 extending parallel to and spaced from the first track 48. Track 50 also extends parallel to and lies adjacent a second section of the seam. A third electrically conductive track 52 interconnects the first and second tracks 48, 50. In the preferred embodiment, a fourth electrically conductive track 54 extends parallel to and spaced from the third track 5 and likewise interconnects the first and second tracks. Track 48 is somewhat longer than track 50 and includes a generally downwardly extending leg 56 illustrated in FIG. 1.

Figure 2:
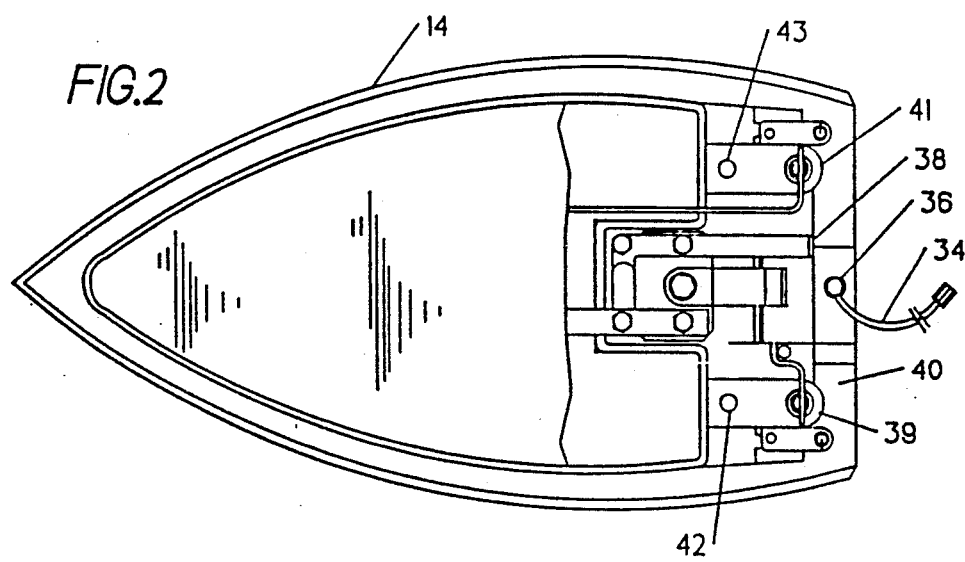
FIG. 2 is a top plan view of the soleplate of the iron illustrating details of the invention.
Figure 3:
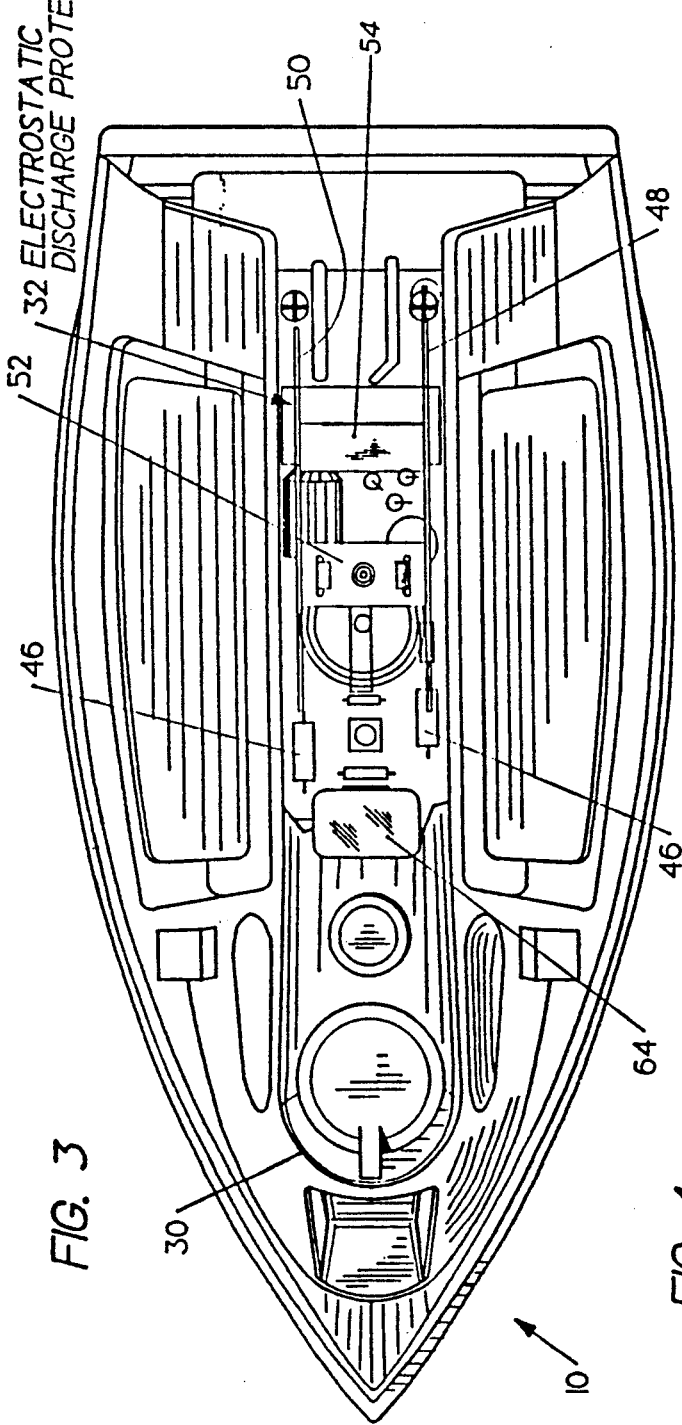
FIG. 3 is a plan view of the iron, with the top handle being removed to illustrate the electronic components mounted on the inner surface of the lower handle, and with the electrostatic protection device of the present invention overlying the electronic components.

An electrical conductor 34 is connected at a first end to downwardly extending leg 56 and as shown in FIG. 2, is connected at a second end to soleplate 14. Second end 36 is connected to U-shaped bracket 40 attached to the soleplate. Soleplate 14 includes a generally U-shaped resistance element 42 mounted thereon as is conventional within the art. A.C. electrical power is delivered to element 42 via power cord 24; the power supply is connected to the resistance element at location 38 and terminal 39. A thermostat (not shown) is connected to location 38 and to one 41 of the terminals of resistance element 42 for controlling the supply of electrical power to the element.

In many modern electric irons, electronic components are provided to afford various automatic features such as signal lights, signal tones, and automatic shut-off which functions to electrically deactivate the iron when the iron has not moved for a predetermined period of time. Typically, the electronic components, such as resistors, capacitors, and microchips 46 are mounted on the upper surface of lower handle member 30. The electronic components are susceptible to damage by voltage generated from an electrostatic discharge. It has been determined that upwards of 20,000 to 26,000 volts may be developed from an electrostatic discharge which can be generated when the user grasps the iron's handle.

As noted previously, upper handle member 28 and lower handle member 30 are joined along a longitudinally extending seam 62. It has been determined that the electrostatic discharge voltage may gain access to the interior of the handle along the longitudinally extending seam. Further, the electrostatic discharge voltage may gain access to the interior of the handle via the opening created when switch 22 is moved downwardly when the user turns the power on. As illustrated in FIG. 4, switch 22 includes a metallic return spring 66 which readily conducts the electrostatic discharge voltage.

As noted previously, upper handle member 28 includes a member 32 Member 32 is formed from a suitable conductive material and functions as a electrostatic discharge collector and carrier. Member 32 provides an extremely low resistance path for the electrostatic discharge gaining access into the interior of the handle.

Specifically, tracks 48 and 50 of member 32 collect any electrostatic discharge voltage which gains access into the interior of the handle through either side of longitudinally extending seam 62. Track 52, which is in engagement with spring 66 of switch 22 collects any electrostatic discharge voltage gaining access into the handle through the opening at switch 22. Tracks 52 and 54 interconnect tracks 48 and 50. Track 48 terminates in downwardly extending leg 56 which in turn connects to conductor 34. As illustrated in FIGS. 1 and 2, conductor 34 is connected to soleplate 14, which is normally held at a low potential.

There is a relatively small gap, for example, less than 3/32 of an inch, between terminal 41 of resistor 42 and resistor sheath 43 which is in intimate contact with soleplate 14 and is electrically at the same potential as connection 36 of conductor 34. The high electrostatic voltage which is then stored in soleplate 14 will eventually jump the gap between resistor sheath 43 and terminal 41 of the resistor for subsequent conduction via cord 24 connected at location 38, and terminal 39 to the A.C. outlet ground.

Member 32 forms an effective electrostatic discharge protection means for iron 10 which is relatively easy to manufacture and to install within the handle. Electrostatic discharge protection means 32 has proven to be effective in protecting the electronic components mounted in the handle against damage from high voltage electrostatic discharge.

While a preferred embodiment of the present invention has been described and illustrated, the invention should not be limited thereto but may be otherwise embodied within the scope of the following claims.

I claim:

1. An electric iron having a handle including a first member housing electronic components and a second member overlying the first member; a soleplate; an electrically operated resistance element in heat transfer relation with the soleplate; first electrical conductor means connected to said resistance element for connecting said resistance element to a source of electrical power; and electrostatic discharge protection means mounted in said second member of said handle, said electrostatic discharge protection means comprising:

a first electrically conductive track extending parallel to and lying adjacent a first section of a seam formed by joining said first and second handle members, a second electrically conductive track parallel to and spaced from said first track and extending parallel to and lying adjacent a second section of said seam, and a third electrically conductive track interconnecting said first and second tracks, and second electrical conductor means connected to a selected one of said first or second tracks and to a portion of said iron normally held at a relatively low potential for transmitting any electrostatic discharge collected by said electrostatic discharge protection means to said low potential iron portion.

2. An electric iron in accordance with claim 1 wherein said low potential iron portion is said soleplate.

3. An electric iron in accordance with claim 2 wherein said second handle member includes a spring-loaded power switch, said spring of said switch being electrically conductive and electrically connected to said electrostatic discharge protection means.

4. An electric iron in accordance with claim 3 wherein said spring is in electrical contact with said third electrically conductive track.

5. An electric iron in accordance with claim 1 wherein said second handle member includes a spring-loaded power switch, said spring of said switch being electrically conductive and electrically connected to said electrostatic discharge protection means.

6. An electric iron in accordance with claim 5 wherein said spring is in electrical contact with said third electrically conductive track.

* * * * *